United States Patent
Jung et al.

(10) Patent No.: US 12,392,554 B2
(45) Date of Patent: Aug. 19, 2025

(54) APPARATUS FOR PROCESSING A SUBSTRATE AND METHOD OF OPERATING THE SAME

(71) Applicants: SK hynix Inc., Icheon-si (KR); EUGENE TECHNOLOGY CO., LTD., Yongin-si (KR)

(72) Inventors: Min Jin Jung, Hwaseong-si (KR); Tae Hwan Kim, Yongin-si (KR); Min Woong Kang, Hwaseong-si (KR); Hyun Jun Yoo, Seoul (KR); Sung Ho Kang, Yongin-si (KR); Song Hwan Park, Yongin-si (KR); Bo Sun Kim, Yongin-si (KR); Hong Won Lee, Yongin-si (KR); Joo Hyun Cho, Yongin-si (KR); Yong Tak Jin, Yongin-si (KR)

(73) Assignees: SK hynix Inc., Icheon-si (KR); EUGENE TECHNOLOGY CO., LTD., Yongin-si (KR)

( * ) Notice: Subject to any disclaimer, the term of this patent is extended or adjusted under 35 U.S.C. 154(b) by 468 days.

(21) Appl. No.: 17/990,481

(22) Filed: Nov. 18, 2022

(65) Prior Publication Data

US 2023/0082802 A1     Mar. 16, 2023

Related U.S. Application Data

(63) Continuation-in-part of application No. 16/700,921, filed on Dec. 2, 2019, now abandoned.

(30) Foreign Application Priority Data

Jun. 17, 2019   (KR) .................. 10-2019-0071561

(51) Int. Cl.
F27B 5/16     (2006.01)
F27B 5/06     (2006.01)
(Continued)

(52) U.S. Cl.
CPC ................ *F27B 5/16* (2013.01); *F27B 5/14* (2013.01); *F27B 5/18* (2013.01); *F27B 17/0025* (2013.01);
(Continued)

(58) Field of Classification Search
CPC ............ C23C 16/4411; C23C 16/4412; C23C 16/4583; C23C 16/46; H01L 21/02271;
(Continued)

(56) References Cited

U.S. PATENT DOCUMENTS 6,204,194 B1 *  3/2001  Takagi ............. C23C 16/45504
                                                  438/785
11,367,633 B2 *  6/2022  Yamaguchi ......... C23C 16/4584
(Continued)

FOREIGN PATENT DOCUMENTS

CN       102653883 A      9/2012
CN       106367805 A      2/2017
(Continued)

*Primary Examiner* — Charlee J. C. Bennett
(74) *Attorney, Agent, or Firm* — WILLIAM PARK & ASSOCIATES LTD.

(57) ABSTRACT

An apparatus for processing a substrate includes a reaction tube, a side cover, a heater, a first gas supplier, a second gas supplier and a controller. The reaction tube is configured to receive a substrate boat in which a plurality of the substrate is received to process the substrate. The side cover is configured to receive the reaction tube. The heater lines the interior of the side cover. The first gas supplier is provided to an upper portion of the side cover to supply a cooling gas at a first supplying rate to a space between the side cover and the reaction tube. The second gas supplier is provided to a lower portion of the side cover to supply the cooling gas at a second supplying rate different from the first supplying rate to the space between the side cover and the reaction tube. The controller controls the reaction tube.

14 Claims, 12 Drawing Sheets

(51) Int. Cl.
  *F27B 5/14* (2006.01)
  *F27B 5/18* (2006.01)
  *F27B 17/00* (2006.01)
  *H01L 21/67* (2006.01)
  *H01L 21/673* (2006.01)

(52) U.S. Cl.
  CPC ... *F27B 2005/064* (2013.01); *H01L 21/67248* (2013.01); *H01L 21/67303* (2013.01)

(58) Field of Classification Search
  CPC ......... H01L 21/67011; H01L 21/67098; H01L 21/67248
  USPC ............................................. 118/715
  See application file for complete search history.

(56) References Cited

U.S. PATENT DOCUMENTS

| | | | |
|---|---|---|---|
| 2008/0003362 | A1 | 1/2008 | Nodera et al. |
| 2010/0130024 | A1* | 5/2010 | Takasawa ............... C23C 16/50 |
| | | | 438/761 |
| 2011/0223693 | A1* | 9/2011 | Sugishita ............ F27B 17/0025 |
| | | | 438/5 |
| 2012/0325804 | A1* | 12/2012 | Kobayashi ........ H01L 21/67109 |
| | | | 219/430 |
| 2016/0027661 | A1* | 1/2016 | Sato ..................... H05B 3/0047 |
| | | | 219/412 |
| 2017/0183771 | A1* | 6/2017 | Yoo ....................... C23C 16/455 |
| 2018/0355481 | A1 | 12/2018 | Kang et al. |
| 2019/0276938 | A1* | 9/2019 | Sugishita ................ C23C 16/52 |

FOREIGN PATENT DOCUMENTS

| | | |
|---|---|---|
| CN | 106920761 A | 7/2017 |
| JP | F08181046 A | 7/1996 |
| JP | 2002261028 A | 9/2002 |
| JP | 2012080081 A | 4/2012 |
| JP | 2014042042 A | 3/2014 |
| KR | 100532702 B1 | 11/2005 |
| KR | 1020120026452 A | 3/2012 |
| KR | 1020120079309 A | 7/2012 |
| KR | 1020140116796 A | 10/2014 |
| KR | 1020190029467 A | 3/2019 |
| WO | 2018100826 A1 | 6/2018 |

* cited by examiner

HEATER CONTROL MEMBER — 210

COOLING GAS CONTROL MEMBER — 220

EXHAUST CONTROL MEMBER — 230

APPARATUS FOR PROCESSING A SUBSTRATE AND METHOD OF OPERATING THE SAME

CROSS-REFERENCE TO RELATED APPLICATIONS

This application is a continuation-in-part of U.S. patent application Ser. No. 16/700,921, filed on Dec. 2, 2019, which claims priority under 35 U.S.C. § 119(a) to Korean Application No. 10-2019-0071561, filed on Jun. 17, 2019, in the Korean Intellectual Property Office, the entire disclosure of which is incorporated herein by reference.

BACKGROUND

1. Technical Field

Various embodiments may generally relate to an apparatus and a method of processing a substrate, more particularly, to an apparatus and a method of processing a substrate that may be capable of controlling a cooling speed and temperature uniformity in a reaction tube.

2. Related Art

Semiconductor fabrication processes may include a process of processing a substrate to form a layer on the substrate through a chemical vapor deposition (CVD) process. The substrate processing process may include loading a substrate boat with a plurality of the substrates into a reaction tube, and supplying a reaction gas into the reaction tube in a vacuum.

The temperature of the substrate may increase during the substrate processing process. Thus, after the substrate processing process, it may be required to cool the substrate boat in order to transfer the substrate. An atmospheric pressure may be applied to the reaction tube. External air or nitrogen gas may also be supplied to the reaction tube to cool the reaction tube. An unloading temperature of the substrate boat may be controlled. The substrate boat may then be unloaded from the reaction tube.

When the reaction tube is naturally cooled, a cooling time may be so long so that the productivity level may decline. In contrast, when the reaction tube is rapidly cooled, a crack may be generated at byproducts on an inner wall of the reaction tube, generated in the substrate processing process. Particles may be generated from the crack of the byproducts.

Therefore, a technology for cooling the reaction tube, while preventing productivity loss from natural cooling and minimizing stresses applied to the byproducts caused by a forced cooling, is being pursued.

SUMMARY

In example embodiments of the present disclosure, an apparatus for processing a substrate may include a reaction tube, a side cover, a heater, a first gas supplier, a second gas supplier and a controller. The reaction tube may be configured to receive a substrate boat in which a plurality of the substrate may be received to process the substrate. The heater may line the interior of the side cover. The side cover may be configured to receive the reaction tube. The first gas supplier may be provided to an upper portion of the side cover to supply a cooling gas at a first supplying rate to a space between the side cover and the reaction tube. The second gas supplier may be provided to a lower portion of the side cover to supply the cooling gas at a second supplying rate different from the first supplying rate to the space between the side cover and the reaction tube. The controller may control the reaction tube.

In example embodiments of the present disclosure, based on a method of processing a substrate, substrates in a substrate boat may be processed in a reaction tube. A cooling gas may be supplied to a space between the reaction tube and a side cover, which may be configured to receive the reaction tube, to cool the reaction tube to no more than a predetermined temperature. The substrate boat may then be unloaded from the reaction tube. In example embodiments, the cooling of the reaction tube may include supplying the cooling gas at a first supplying rate to an upper region of the space, supplying the cooling gas at a second supplying rate, different from the first supplying rate to a lower region of the space. The cooling gas may then be exhausted from the space.

BRIEF DESCRIPTION OF THE DRAWINGS

The above and another aspect, features and advantages of the subject matter of the present disclosure will be more clearly understood from the following detailed description taken in conjunction with the accompanying drawings, in which:

FIG. 5 is a block diagram, illustrating a controller, in accordance with example embodiments.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1A:
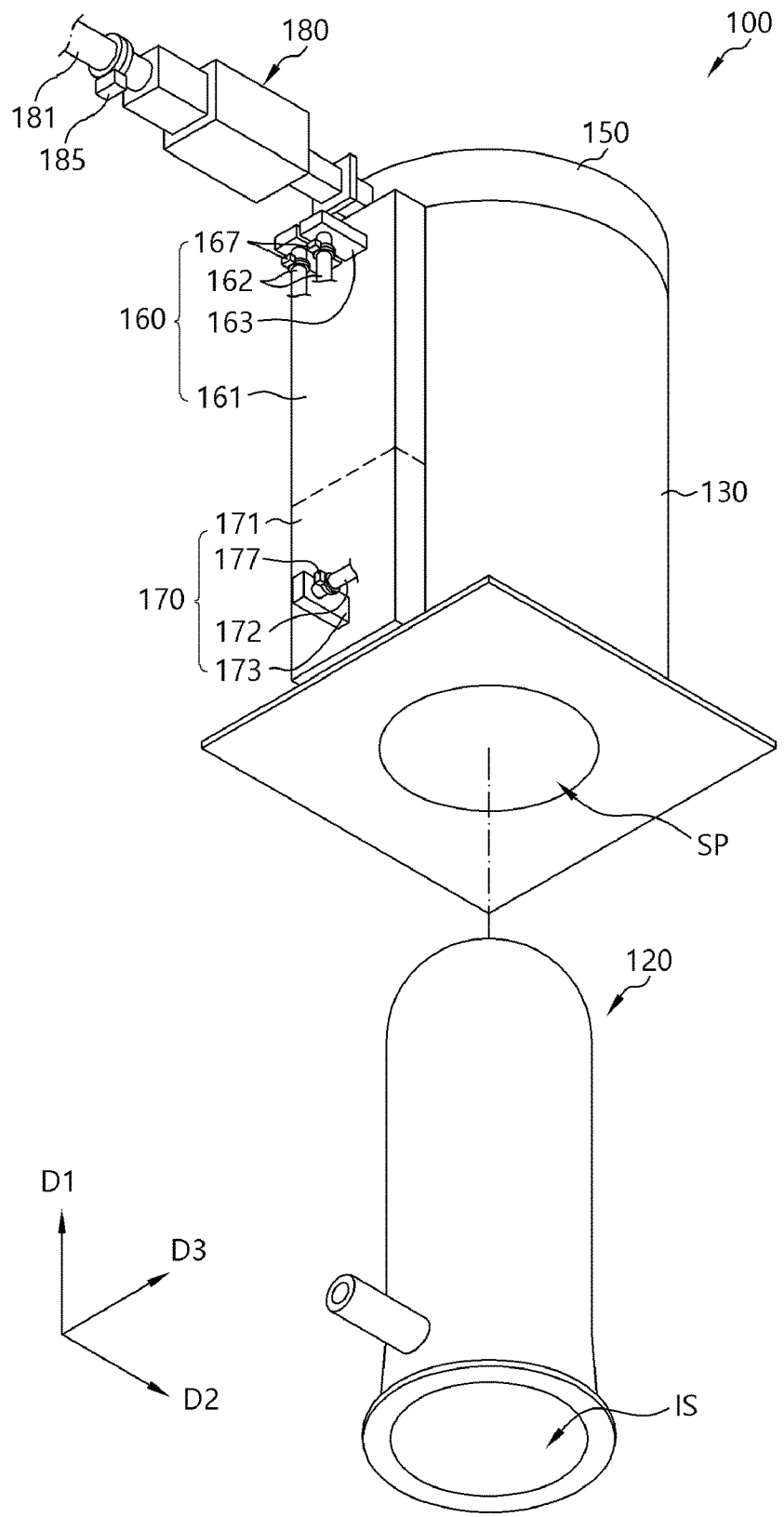
FIGS. 1A to 1C are exploded perspective views, illustrating an apparatus for processing a substrate, in accordance with example embodiments.
Figure 1B:
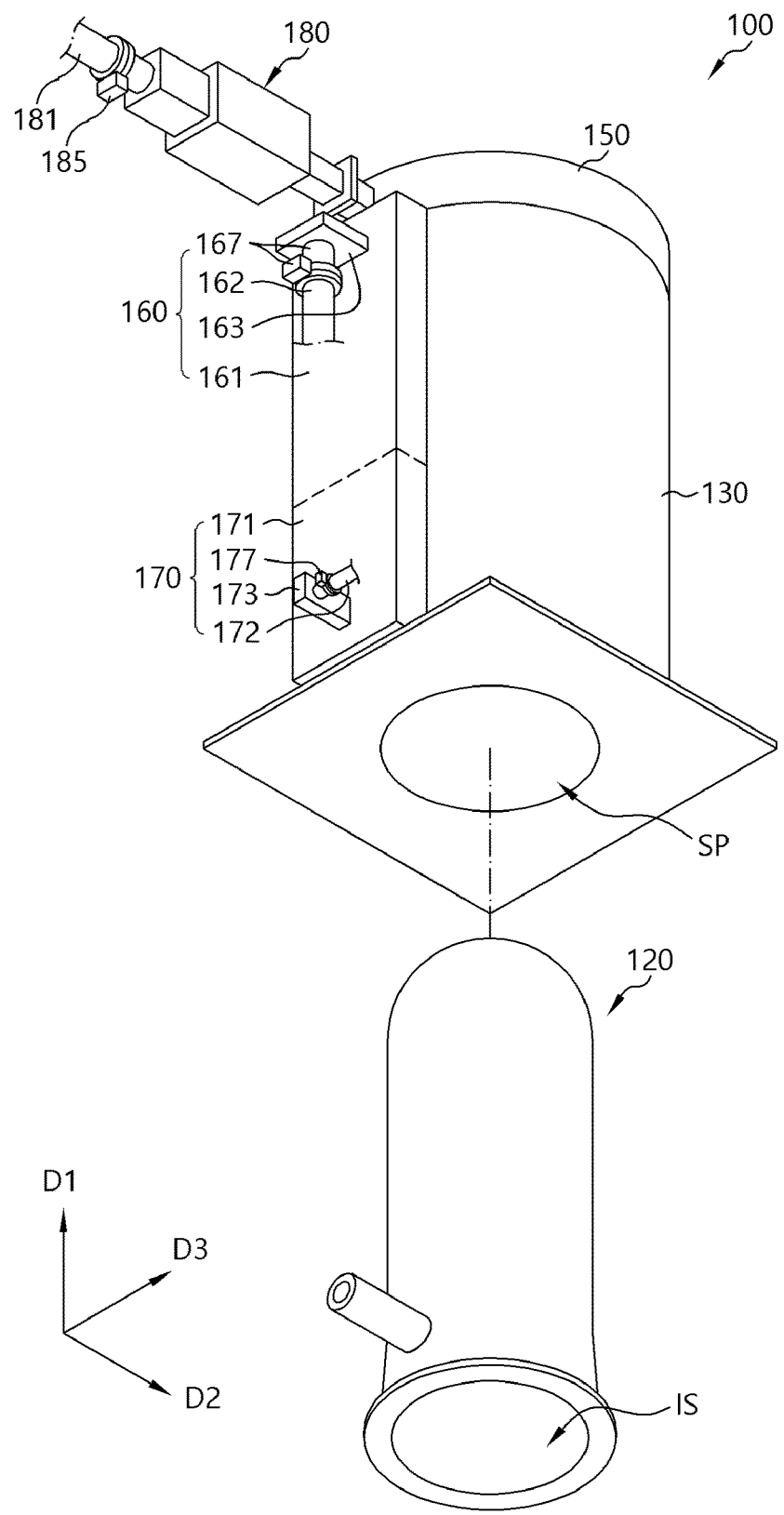
Figure 1C:
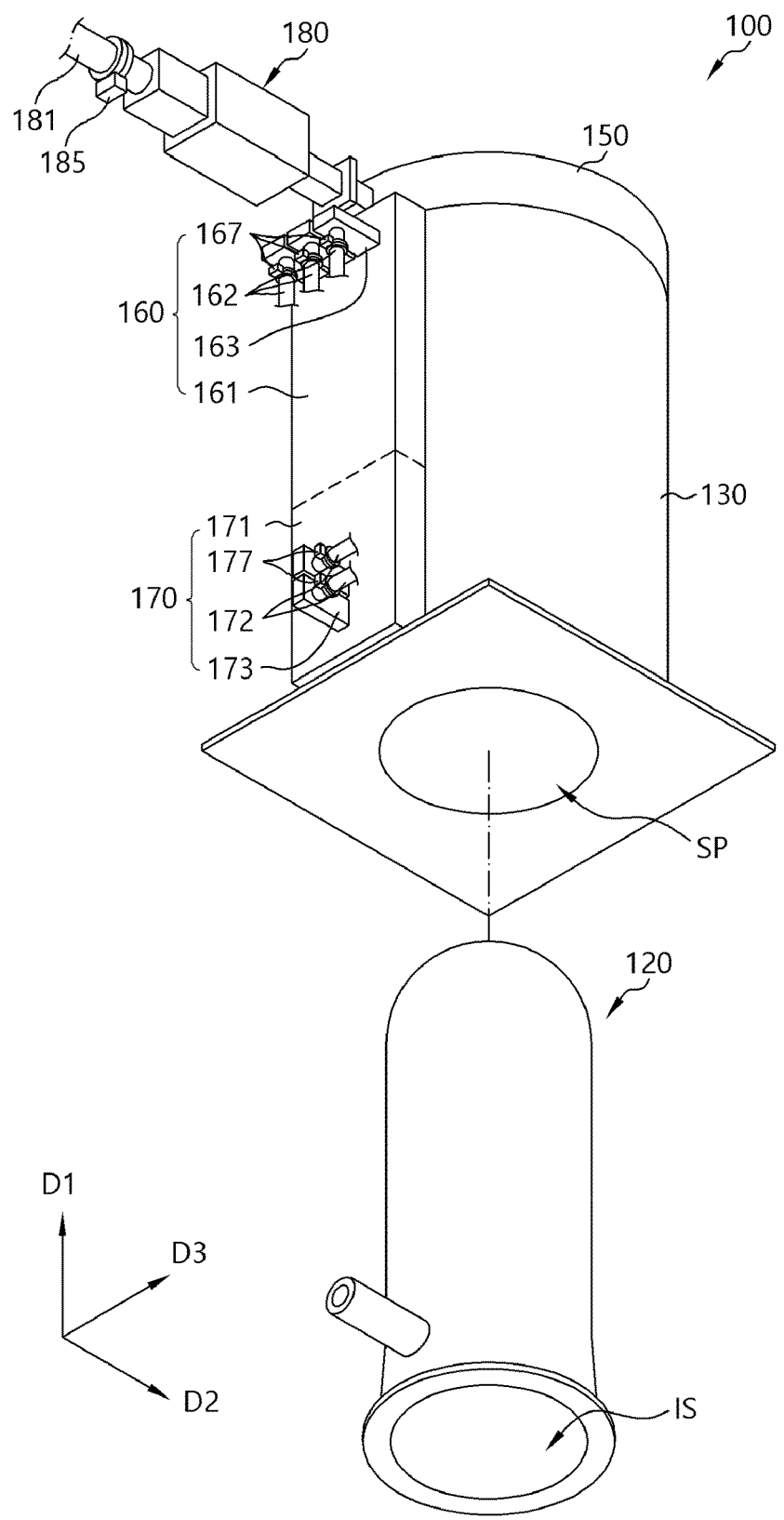
Figure 2A:
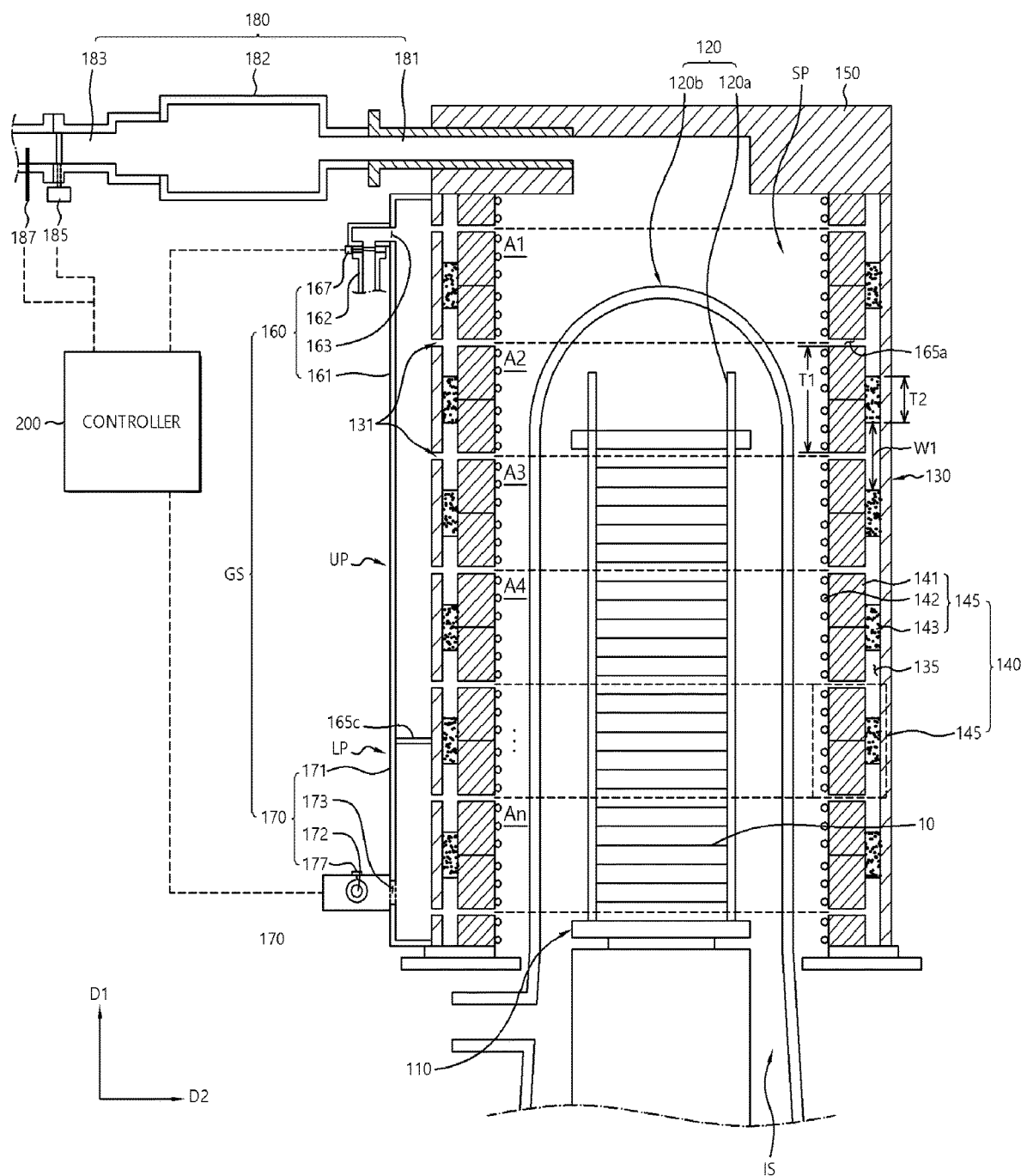
FIG. 2A is a longitudinal cross-sectional view, illustrating an apparatus for processing a substrate, in accordance with example embodiments.
Figure 2B:
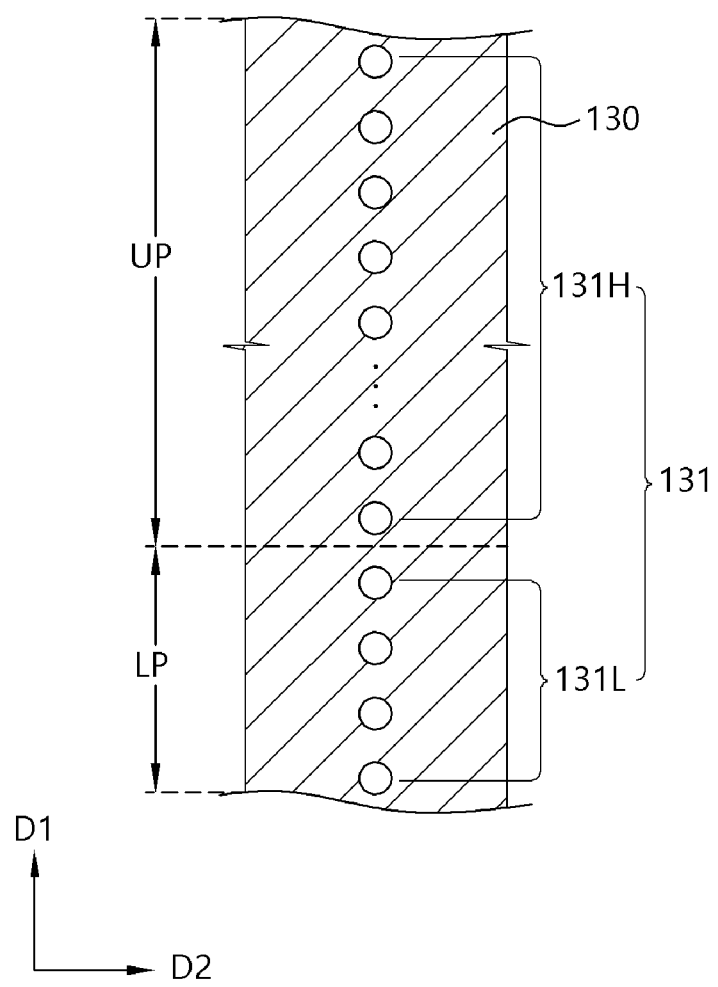
FIG. 2B is a side view showing gas transmission holes of a side cover, in accordance with example embodiments.
Figure 2C:
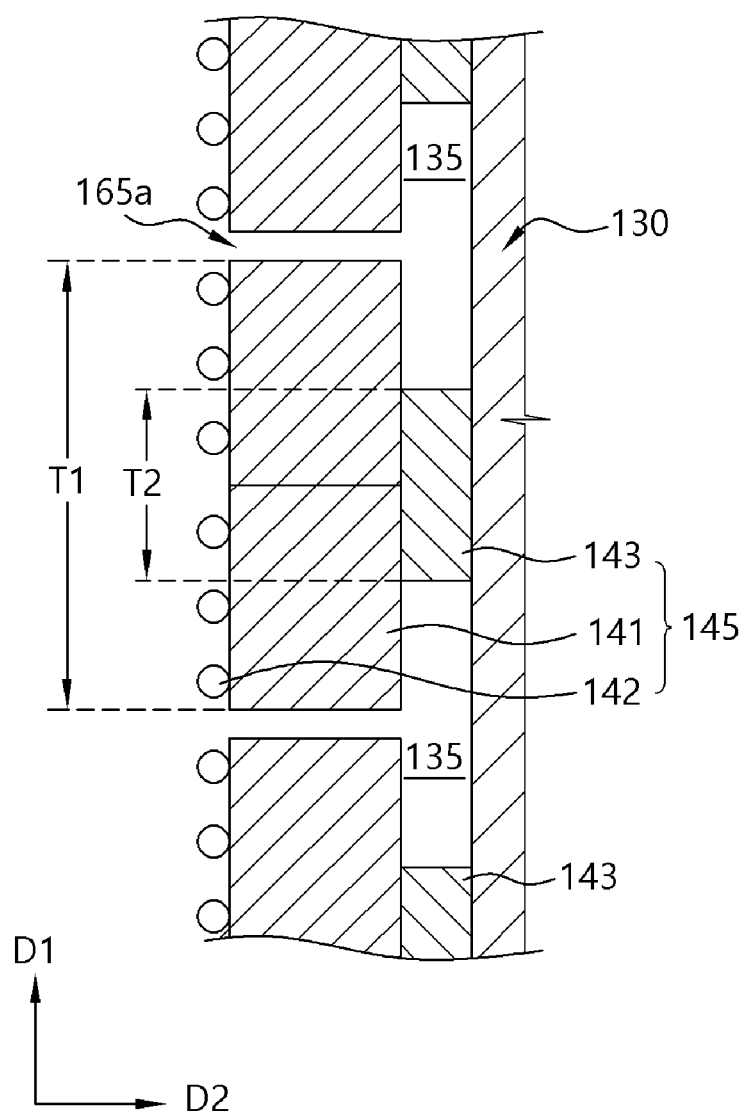
FIG. 2C is a cross-sectional view showing a unit heater, in accordance with example embodiments.
Figure 3A:
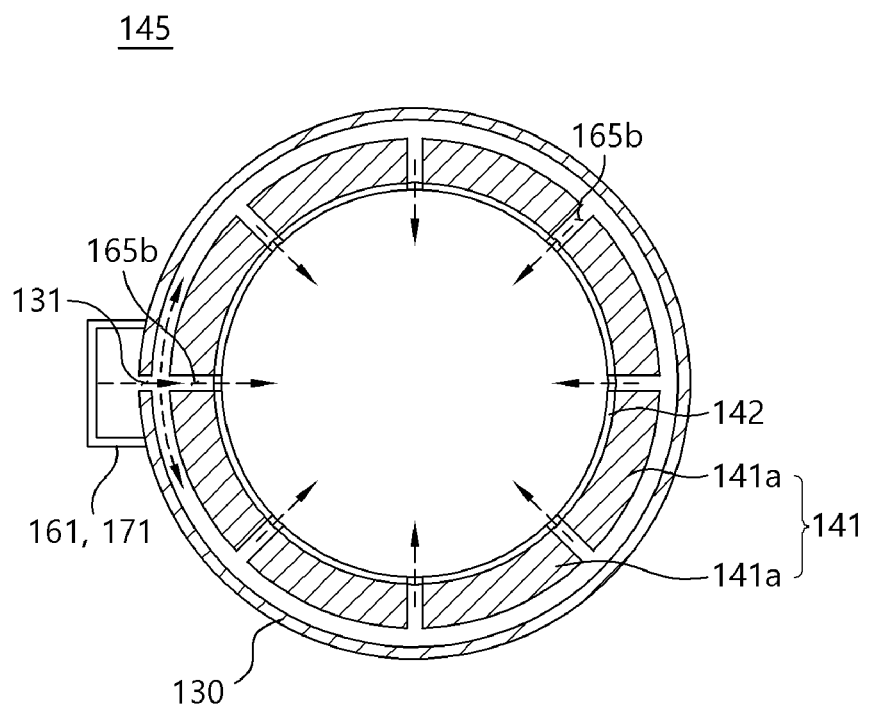
FIG. 3A is a plane view showing a unit heater in accordance with example embodiments.
Figure 3B:
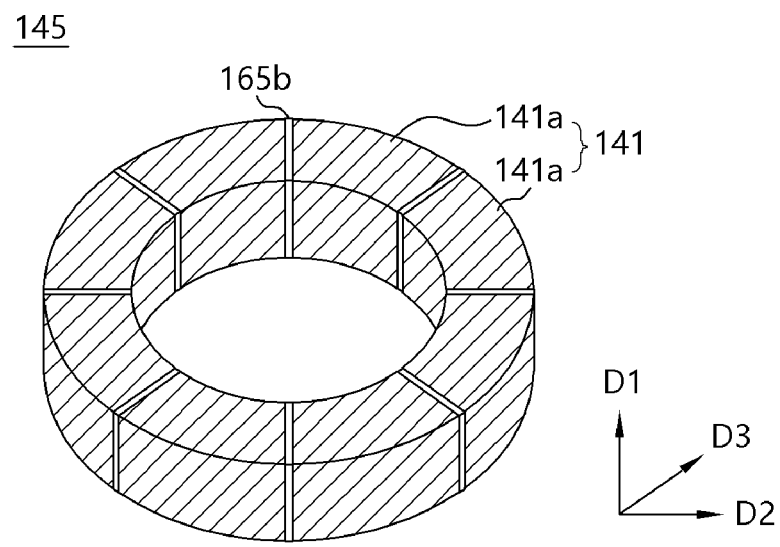
FIG. 3B is a perspective views showing the unit heater in accordance with example embodiments.
Figure 3C:
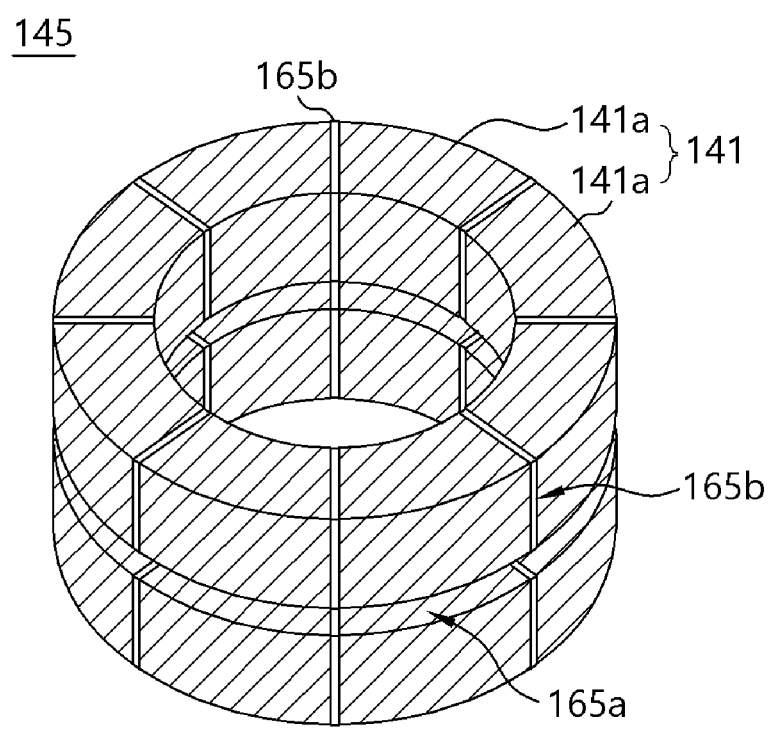
FIG. 3C is a perspective view showing stacked unit heaters in accordance with example embodiments.

FIGS. 1A to 1C are exploded perspective views, illustrating an apparatus for processing a substrate, in accordance with example embodiments. FIG. 2A is a longitudinal cross-sectional view, illustrating an apparatus for processing a substrate, in accordance with example embodiments. FIG. 2B is a side view showing gas transmission holes of a side cover, in accordance with example embodiments. FIG. 2C is a cross-sectional view showing a unit heater, in accordance with example embodiments. FIG. 3A is a plane view showing a unit heater in accordance with example embodiments. FIG. 3B is a perspective view showing the unit heater in accordance with example embodiments. FIG. 3C is a perspective view showing stacked unit heaters in accordance with example embodiments.

Referring to FIG. 1A to FIG. 3C, an apparatus 100 for processing a substrate, in accordance with example embodiments, may include a substrate boat 110, a reaction tube 120, a side cover 130, a heater 140, a lid 150, a cooling gas supplier GS, an exhauster 180 and a controller 200.

The substrate boat 110 may process a plurality of substrates 10 at the same time. For example, the substrate boat 110 may extend along a first direction D1. Further, the plurality of substrates 10, such as a plurality of wafers, may be sequentially received along the first direction D1 in the substrate boat 110. The substrate boat 110 may have a plurality of processing spaces A1~An in which the substrates 10 may be individually processed.

The reaction tube 120 may have an internal space IS. The substrate boat 110 may be inserted in the internal space IS of the reaction tube 120 during the substrate-processing step. The reaction tube 120 may include a single tube or a plurality of tubes. For example, the reaction tube 120 may include an inner tube 120a and an outer tube 120b.

The side cover 130 may be arranged to surround the reaction tube 120. The side cover 130 may have a cylindrical shape having an opened upper surface and an opened lower surface. The side cover 130 may be spaced apart from the outer surface of the reaction tube 120 by a setting distance. The side cover 130 may include a metal, such as a stainless metal. The side cover 130 may include a plurality of gas transmission holes 131. For example, the plurality of gas transmission holes 131 may be arranged along the first direction D1 with a uniform gap. The gas transmission holes 131 may be arranged at a selected portion of the side cover 130.

The heater 140 may apply heat to the reaction tube 120. The heater 140 may be arranged between the reaction tube 120 and the side cover 130. For example, the heater 140 may extend in the first direction D1. For example, the heater 140 may also include a substantially cylindrical structure having a diameter smaller than a diameter of the side cover 130 and lager than the diameter of the reaction tube 120.

For example, the heater 140 may include a plurality of first holes 165a extending a second direction D2 and a third direction D3 for forming a horizontal plane. The heater 140 extending in the first direction D1 may be divided into a plurality of unit heaters 145 by the plurality of first holes 165a.

In an example embodiment, referring to FIG. 2C, each of the unit heaters 145 may include an adiabatic block 141 and a coil 142. For example, the adiabatic block 141 may include an annular shape. The adiabatic block 141 may include at least one of silica and alumina as a main material. For example, the adiabatic block 141 may have a thickness T1 of about 30 mm to about 40 mm. The coil 142 may be arranged on an inner surface of the adiabatic block 141 in a linear shape such as a spiral shape, an oblique shape, etc.

Each of the unit heaters 145 may further include an adhesion pattern 143 for bonding an outer surface of the adiabatic block 141 and an inner surface of the side cover 130. The adhesion pattern 143 may have an annular shape. The adhesion pattern 143 may include a thickness T2 that is shallower than the thickness T1 of the adiabatic block 141. For example, the thickness T2 of the adhesion pattern 143 may be about 15 mm to about 20 mm and a width of the adhesion pattern 143 may be about 30 mm to about 50 mm, but it is not limited here. For example, the adhesion pattern 143 may be positioned between the adjacent first holes 165a. As described above, the adhesion patterns 143 of the unit heater 145 may attach the adiabatic block 141 to the inner surface of the side cover 130, respectively. Since the thickness T2 of the adhesion pattern 143 is shallower than the thickness T1 of the adiabatic block 141, inner passageways 135 may be defined between the adhesion patterns 143 of the adjacent unit heaters 145.

Each of the unit heaters 145 may further include a plurality of second holes 165b, as shown in FIG. 3A to FIG. 3C. The plurality of second holes 165b may be formed in the adiabatic block 141 of each unit heater 145. That is, the adiabatic block 141 of each unit heater 145 may be divided into a plurality of adiabatic regions 141a by the plurality of second holes 165b. For example, the plurality of second holes 165b may be radially formed in the adiabatic block 141 of each unit heater 145.

In example embodiments, the first hole 165a may be positioned between adjacent adiabatic blocks 141, the second hole 165b may be positioned between adjacent adiabatic regions 141a, and the inner passageway 135 may be positioned between adjacent adhesion patterns 143.

The plurality of unit heaters 145 may provide different is temperatures depending on a height of the reaction tube 120, respectively.

As described above, the internal space SP of the apparatus 100 may be vertically divided into a plurality of sub-spaces A1~An along the first direction D1. For example, each of the unit heaters 145 may be located for each of the sub spaces A1~An. Temperatures of the sub spaces A1~An may be individually controlled by the unit heaters 145, respectively.

The lid 150 may be arranged on the upper end of the side cover 130. The lid 150 may be configured to seal the opened upper surface of the side cover 130. The lid 150 may include a metal material, such as a stainless metal.

The cooling gas supplier GS may supply the cooling gas to the internal space SP of the apparatus 100. The cooling gas supplier GS may include a first gas supplier 160 and a second gas supplier 170. The first gas supplier 160 may provide a cooling gas to an upper portion UP of the apparatus 100. For example, the cooling gas may include at least one external air and nitrogen gas. The first gas supplier 160 may be positioned at an upper region of an outer surface of the side cover 130.

The first gas supplier 160 may include a first duct 161 and at least one first gas line 162. The first duct 161 may be installed outside of the side cover 130. The first duct 161 may be positioned to cover the gas transmission holes 131H arranged in the side cover 130 defined by the upper portion UP. The first duct 161 is may be arranged to have a setting distance from the outer surface of the side cover 130 while covering the gas transmission holes 131H arranged in the side cover 130. Thus, a first external cooling space AP1 may be defined between the first duct 161 and the outer surface of the side cover 130.

The first gas supplier 160 may further include a first inlet 163 and at least one first opening/closing valve 167. The first inlet 163 may insert and fix the first gas line 162 to the first duct 161. The first opening/closing valve 167 may be installed in the first gas line 162 and may control a supplying of the cooling gas.

The second gas supplier 170 may provide the cooling gas to a lower portion LP of the apparatus 100. The second gas supplier 170 may be positioned at a lower region of the outer surface of the side cover 130.

The second gas supplier 170 may include a second duct 171 and at least one second gas line 172. The second duct 171 may be installed outside of the side cover 130 under the first duct 161. More detailed, the second duct 171 may be positioned to cover the gas transmission holes 131L arranged in the side cover 130 defined by the lower portion LP. The second duct 171 may be arranged to have the setting distance from the outer surface of the side cover 130 while covering the gas transmission holes 131L arranged in the side cover 130. Thus, a second external cooling space AP2 may be defined between the second duct 171 and the outer surface of the side cover 130.

At least one of the first gas supplier 160 and the second gas supplier 170 may include at least one partition 165c. The partition 165c may be positioned between the one of the first and second ducts 161 and 171 and the outer surface of the side cover 130 to be parallel to the horizontal direction. For example, the partition 165c may be arranged at an interface between the upper portion UP and the lower portion LP. The first external cooling space AP1 and the second external cooling space AP2 may be divided by the partition 165c.

In example embodiments, the first duct 161 may have a length that is longer than that of the second duct 171. Thus, the first duct 161 may cover a greater number of the gas transmission holes 131H than the second duct 171.

The second gas supplier 170 may further include a second inlet 173 and at least one first opening/closing valve 177. The second inlet 173 may insert and fix the second gas line 172 to the second duct 171. The second opening/closing valve 177 may be installed in the second gas line 172 and may control a supplying of the cooling gas.

In example embodiments, the first gas line 162 may have a larger diameter than a diameter of the second gas line 172, to supply more cooling gas to the upper portion UP, as shown in FIG. 18.

In example embodiments, a diameter of the first gas line 162 may be the same as a diameter of the second gas line 172. When the first gas line 162 and the second gas line 172 has the same diameter, the first gas supplier 160 may include a greater number of first gas lines 162 than the number of second gas lines 172, to supply more cooling gas to the upper portion UP, as shown in FIG. 1C.

The exhauster 180 may be installed on the side cover 130. For example, the exhauster 180 may be connected with the lid 150 to exhaust the cooling gas in the side cover 130.

Air inside the apparatus 100, especially, the side cover 130, may be heated by the substrate-processing step. The heated air (hereinafter, hot air) is lighter than the cooling gas, it is mainly distributed at the upper portion UP of the apparatus 100 by convection. For this reason, the temperature of the upper portion UP may be relatively higher than the temperature of the lower portion LP. Thus, to solve a non-uniformity of the temperature of the apparatus 100, the cooling gas provided by the first gas supplier 160 is greater than the cooling gas provided by the second gas supplier 170. Further, a concentration of the hot air in the upper portion UP of the apparatus 100 becomes more severe, because the cooling gas provided from the first and second gas supplier 160 and 170 may be heated during the substrate-processing step. The concentration of the hot air may change the process conditions of the substrates 10 in the reaction tube 120. Accordingly, a process deviation may occur depending on a position of the substrate 10 in the reaction tube 120.

In example embodiments, the exhauster 180 may be disposed in the upper portion UP where a relatively large amount of the hot air is distributed compared to the lower portion LP, so that the hot air may be discharged faster than the lower portion LP.

In example embodiments, the exhauster 180 may include a first exhaust line 181, an exhausting gas processing unit 182, a second exhaust line 183, an exhausting valve 185, and an exhaust measurement member 187.

The first exhaust line 181 may be inserted into the lid 150. One end of the first exhaust line 181 may be connected to the internal space SP through the lid 150.

The exhausting gas processing unit 182 may be connected between the first exhaust line 181 and the second exhaust line 183. For example, the exhausting gas processing unit 182 may remove by-product and ignition material in the exhaust gas.

The second exhaust line 183 may be connected between the exhausting gas processing unit 182 and a pump (or blower, not shown).

The exhausting valve 185 may be installed in the second exhaust line 183. For example, the exhausting valve 185 may be closed during the exhausting operation of the apparatus 100.

The exhaust measurement member 187 may be installed in at least one of the first exhaust line 181, the exhausting gas processing unit 182 and the second exhaust line 183. The exhaust measurement member 187 may measure an exhaust pressure and/or the exhaust speed of the exhauster 180. The exhaust pressure and/or the exhaust speed measured by the exhaust measurement member 187 may be transmitted to the controller 200.

In example embodiment, an exhausting amount of the exhauster 180 may be greater than a supplying amount of the first gas supplier 160. Further, the exhausting amount of the exhauster 180 may be greater than a supplying amount of the second gas supplier 170. In addition, the exhausting amount of the exhauster 180 may be greater than the supplying amounts of the first and second gas suppliers 160 and 170.

In example embodiment, the exhausting amount of the exhauster 180 may be adjusted by a diameter of the first exhaust line 181. For example, the diameter of the first exhaust line 181 may be greater than the diameter of the first gas line 162. Further, the diameter of the first exhaust line 181 may be greater than the diameter of the second gas line 172. For example, the exhausting amount of the exhauster 180 may be adjusted by a capacity of the pump (or the blower).

In example embodiment, the cooling gas through the first gas line 162 of the first gas suppliers 160 may be transmitted to the first external cooling space AP1 defined by the first duct 161 and the partition 165c. The cooling gas in the first external cooling space AP1 may be evenly diffused along the outer surface of the side cover 130 to cool the side cover 130. The cooling gas in the first external cooling space AP1 may be transmitted to the inner passageways 135 in the side cover 130 through the gas transmission holes 131H. The cooling gas in the inner passageways 135 may evenly cool the inner surface of the side cover 130, the adhesion patterns 143 and the is outer surface of the adiabatic block 141 defining the inner passageway 135. And then, the cooling gas in the inner passageways 135 may be transmitted to the internal space SP through the plurality of first and second holes 165a and 165b. For example, the cooling gas flowing through the first holes 165a may cool the unit heaters 145 adjacent to the corresponding first hole 165a. Since the plurality of second holes 165b are radially arranged in the adiabatic block 141 of the unit heater 145, the plurality of adiabatic regions 141a constituting the unit heater 145 may be rapidly and evenly cool by the cooling gas flowing through the plurality of second holes 165b.

A cooling operation of the second gas supplier 170 may also be substantially the same as the above cooling operation of the first gas supplier 160.

The controller 200 may be configured to control the cooling rate of the apparatus 100, with the reaction tube 120. FIG. 5 is a block diagram illustrating a controller in accordance with example embodiments.

Referring to FIG. 5, the controller 200 may control the cooling rate of the reaction tube 120. For example, the controller 200 may individually control the cooling rates of the vertically arranged sub-spaces A1~An in the apparatus 100. The controller 200 may include a heater control member 210, a cooling gas control member 220 and an exhaust control member 230. Operations of the heater control member 210, the cooling gas control member 220 and the exhaust control member 230 may be illustrated later.

The unit heaters 145 in each sub-spaces A1~An may be individually controlled by the heat control member 210.

The heater control member 210 may drive the unit heater 145 in the region having a relatively low temperature in accordance with a temperature distribution of the regions A1~An to compensate for the low temperature of the region. As a result, the temperature uniformity in the reaction tube 120 may be maintained.

Figure 6:
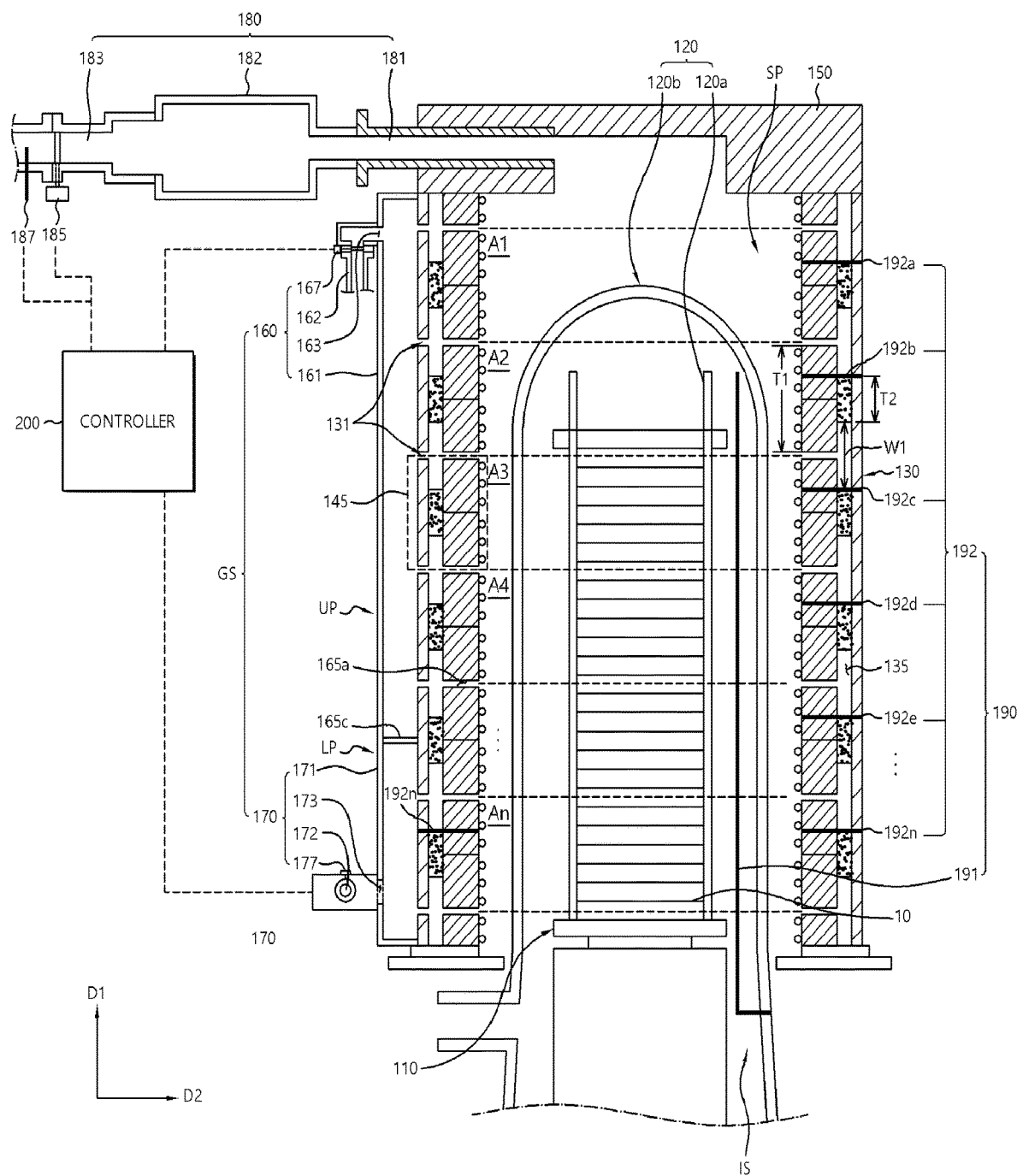
FIG. 6 is a cross-sectional view, illustrating an apparatus for processing a substrate, in accordance with example embodiments.

FIG. 6 is a cross-sectional view, illustrating an apparatus for processing a substrate, in accordance with example embodiments.

Referring to FIG. 6, the apparatus 100, for processing the substrate, may further include a temperature sensor 190.

The temperature sensor 190 may measure temperatures of the regions A1~An in the reaction tube 120. The measured temperatures, by the temperature sensor 190, may be provided to the controller 200. The controller 200 may recognize the temperature distribution based on the regions A1~An.

The temperature sensor 190 may include a first temperature detection member 191 and a second temperature detection member 192.

The first temperature detection member 191 may be arranged in the reaction tube 120 to measure the temperatures of the regions A1~An. The first temperature detection member 191, in the reaction tube 120, may measure the temperature in the reaction tube 120 in a vacuum state to identify whether the reaction tube 120 can be normally cooled or not. The first temperature detection is member 191 may be positioned adjacent to the substrate 10 in the reaction tube 120 to measure the temperature in the reaction tube 120. The measured temperature, by the first temperature detection member 191, may correspond to a peripheral temperature of the substrate 10. Thus, a temperature of the substrate 10 may be estimated from the peripheral temperature of the substrate 10.

The first temperature detection member 191 may include a profile thermocouple. The profile thermocouple may be installed between the inner tube 120a and the outer tube 120b of the reaction tube 120. Alternatively, the first temperature detection member 191 may be arranged in the reaction tube 120, for example, the inner tube 120a to measure an actual temperature in the reaction tube 120.

The second temperature detection member 192a-192n may be arranged between the reaction tube 120 and the heater 140. The second temperature detection member 192a-192n may measure the temperatures of the regions A1~An. For example, second temperature detection member 192a-192n may be connected to the heater 140 to measure a temperature of each of the heating members 145. The second temperature detection member 192a-192n may include a spike thermocouple. The second temperature detection member 192a-192n may be in direct contact with the heater 140 or may be arranged between the heater 140 and the reaction tube 120 to measure the temperature or the atmospheric temperature outside of the reaction tube 120, surrounding the heater 140.

The temperatures between the heater 140 and the reaction tube 120, measured by the second temperature detection member 192a-192n, may be provided to the controller 200. The controller 200 may identify whether the regions A1~An can be normally cooled or not, based on the provided temperatures.

For example, when a specific region of the regions A1~An is not be uniformly cooled, the controller 200 may decrease a heating temperature of the unit heater 145 in the specific region, having a relatively high temperature. In contrast, when a specific region of the regions A1~An is cooled relatively rapidly, the controller 200 may increase a heating temperature of the unit heater 145, in the specific region, having a relatively low temperature.

The temperature controls of the heating members 145 may be performed by the heater control member 210 of the controller 200. The heater control member 210 may control the heating members 145 to supply thermal energy to a region among the regions A1~An having a relatively low temperature, based on the temperatures of the regions A1~An measured by the temperature detection members 191 and 192a-192n. As mentioned above, because the hot air may be positioned in the upper region of the reaction tube 120 and the cold air may be positioned in the lower region of the reaction tube 120 due to convection, the temperature deviation between the upper region and the lower region in the reaction tube 120 may be generated.

In order to reduce the temperature deviation, the heater control member 210 may independently control the heating members 145 in a region among the regions A1~An, having a non-uniform temperature distribution, based on the temperatures of the regions A1~An, measured by the temperature detection members 191 and 192a-192n.

The second gas supplier 170 may be positioned at a lower portion of the side cover 130. The second gas supplier 170 may include a second duct 171, connected to the gas supply holes 165 located, outside the lower region of the reaction tube 120.

The first duct 161 and the second duct 171 may supply and distribute the cooling gas. For example, the first duct 161 may extend in a downward direction from an outer surface of the upper portion of the side cover 130. The second duct 171 may be upwardly extended from an outer surface of the lower region of the side cover 130. The first duct 161 may be connected to the second duct 171. An external cooling space may be formed between the first gas supplier 160, the second gas supplier 170, the first duct 161, the second duct 171 and the side surface of the side cover 130.

The plurality of first holes 165a may be provided to the regions A1~An, respectively. That is, the gas plurality of first holes 165a may be positioned in each of the regions A1~An.

FIG. 3A is a lateral cross-sectional view, illustrating an apparatus for processing a substrate, in accordance with example embodiments, and FIGS. 3B and 3C are perspective views illustrating a heating member in accordance with example embodiments.

Referring to FIG. 3C, the unit heater 145 may include the single adiabatic block 141 or the stacked adiabatic blocks 141. The first holes 165a may be provided to each of the adiabatic members 141. The unit heater 145 may include the vertically arranged first holes 165.

In example embodiments, in order to provide the cooling gas with a spiral flow along a peripheral direction of the space, between the side cover 130 and the reaction tube 120, the second holes 165b may be inclined to a central direction of the adiabatic block 141 at an angle of about 35° from a planar view.

In example embodiments, before installing the side cover 130, an inner surface or an outer surface of the adiabatic block 141 may be drilled to form the second hole 165.

The inner passageway 135 may have a width w1, greater than a width of the first hole 165a. The inner passageway 135 may be connected to the first hole 165a. The inner passageway 135 may be connected to the first duct 161 and/or the second duct 171.

For example, a plurality of the inner passageways 135 may be vertically arranged between the adiabatic block 141 of the heater 140 and the side cover 130.

When the cooling gas is injected, from the annular inner passageway 135, toward the central direction of the adiabatic block 141, the cooling gas may be injected to the space between the side is cover 130 and the reaction tube 120, through the gas supply hole 165 of the adiabatic block 141. During the injection of the cooling gas, the spiral flow may be generated in the space between the side cover 130 and the reaction tube 120 along the peripheral direction. The inner passageway 135 may be formed by attaching a band-shaped or an annular adhesion pattern 143 on an outer surface of the adiabatic block 141 or by forming an annular shape on the outer surface of the adiabatic block 141. The annular inner passageway 135 may be provided to the peripheral of the reaction tube 120 in a tubular shape.

A plurality of connection holes 131 may be formed at the side cover 130. The connection holes 131 may be spaced apart from each other by a uniform gap. The connection holes 131 may be positioned in a space, defined by the first duct 161 and the second duct 171. Thus, the external cooling space, the inner passageway 135, and the gas supply holes 165 may be connected with each other through the connection holes 131. Each of the gas supply holes 165 may be connected with either the first gas supplier 160, through the inner passageway 135, the connection hole 131 and the first duct 161, or the second gas supplier 170, through the inner passageway 135, the connection hole 131 and the second duct 171.

A blower may be provided to inlets 163 and 171a of the first and second ducts 161 and 171 through an opening/closing valve 167. The blower may draw the external air as the cooling gas.

The cooling gas, introduced into the external cooling space, may be thermally exchanged with the external air so that the cooling gas may be rapidly heated.

The lower region of the space, between the side cover 130 and the reaction tube 120, where the cold air may be positioned, may have a volume larger than the upper region space between the side cover 130 and the reaction tube 120, where the hot air may be positioned. Thus, a relatively rapid cooling region has a volume of no more than about 50%, for example, about 10% to about 40% of the volume of the space, between the side cover 130 and the reaction tube 120. Therefore, in order to cool he relatively rapid cooling region, it might not be required to connect the second duct 171 of the second gas supplier 170, which may supply the cooling gas having the relatively small amount, with a relatively great amount of the gas supply holes 165. That is, the second duct 171 may be connected to only the gas supply hole 165 provided to the space or the region having the relatively small volume where the cold air may be positioned. In contrast, the first duct 161 of the first gas supplier 160 may be connected to the relatively great amount of the gas supply holes 165 having the relatively large volume where the hot air may be positioned. As a result, the relatively great amount of the cooling gas may be supplied to the upper region where the hot air may be positioned to effectively cool the upper region.

The first duct 161 and the second duct 171 may be integrally formed with each other. Numbers of the gas supply holes 165 connected with the first duct 161 and the second duct 171 may be determined in accordance with positions of the partition 165c. For example, when the regions A1~An or the internal passageway is divided into seven regions or seven passageways, the first duct 161 may be connected to the five upper passageways 135 and the second duct 171 may be connected to the two lower passageways 135. Alternatively, a space divided by the first duct 161 and the partition 165c may have a volume of about 60% to about 90% of the volume of the total space. A space divided by the second duct 171 and the partition 165c may have a volume of about 10% to about 40% of the volume of the total space.

The apparatus 100 may further include an exhaust measurement member 187.

The controller 200 may determine whether the measurement results of the exhaust control member 230, i.e., the exhaust pressure and/or the exhaust speed of the radiant exhauster 180 may be beyond a predetermined set value or not. When the measurement result is beyond the set value, the exhaust control member 230 may output a control signal to decrease the exhaust pressure and/or the exhaust speed of the radiant exhauster 180 to no more than the set value.

The word "predetermined" as used herein with respect to a parameter, such as a predetermined set value, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the exhaust pressure and/or the exhaust speed of the radiant exhauster 180 is beyond the set value, stresses, applied to the byproducts on the inner surface of the reaction tube 120, may be increased to generate a crack in the byproducts. Thus, particles may be generated from the crack in the reaction tube 120. In order to prevent the generation of the particles, the exhaust pressure and/or the exhaust speed of the radiant exhauster 180 may be monitored and controlled through the exhaust measurement member 187 to prevent the crack and the lamination of the byproducts in the reaction tube 120 and to improve the cooling speed compared to the natural cooling speed.

Figure 4A:
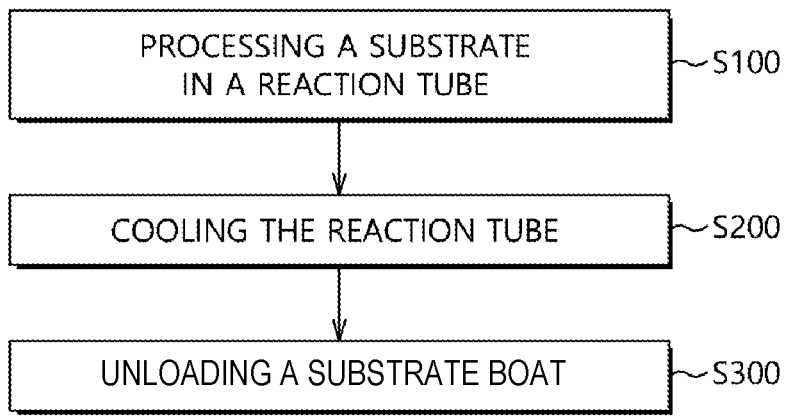
FIG. 4A is a flow chart, illustrating a method of processing a substrate, in accordance with example embodiments.

FIG. 4A is a flow chart, illustrating a method of processing a substrate, in accordance with example embodiments.

Referring to FIG. 4A, in step S100, the substrates stacked in the substrate boat may be processed in the reaction tube. In step S200, the cooling gas may be supplied to the space between the side cover and the reaction tube to cool the reaction tube to no more than the predetermined set temperature. In step S300, the substrate boat may be unloaded from the reaction tube having the temperature of no more than the set temperature.

Particularly, in step S100, the substrates in the substrate boat may be processed in the reaction tube. The substrate-processing step may include a deposition process for forming a layer on the substrate. Because the temperature of the substrate may be increased during the deposition process, it may be required to cool the substrate boat in order to transport the substrate after the deposition process.

In step S200, the cooling gas may be supplied to the space between the side cover and the reaction tube to cool the reaction tube to no more than the predetermined set temperature. In order to cool the substrate boat, atmospheric pressure may be applied to the reaction tube. Simultaneously, cooling gas such as external air, nitrogen gas, etc., may be supplied to the space between the side cover and the reaction tube to cool the reaction tube, thereby controlling the unloading temperature of the substrate boat.

In step S300, the substrate boat may be unloaded from the reaction tube having the temperature of no more than the set temperature. When the reaction tube is cooled to no more than the set temperature after controlling the unloading temperature of the substrate boat, the substrate boat may be unloaded from the reaction tube.

Figure 4B:
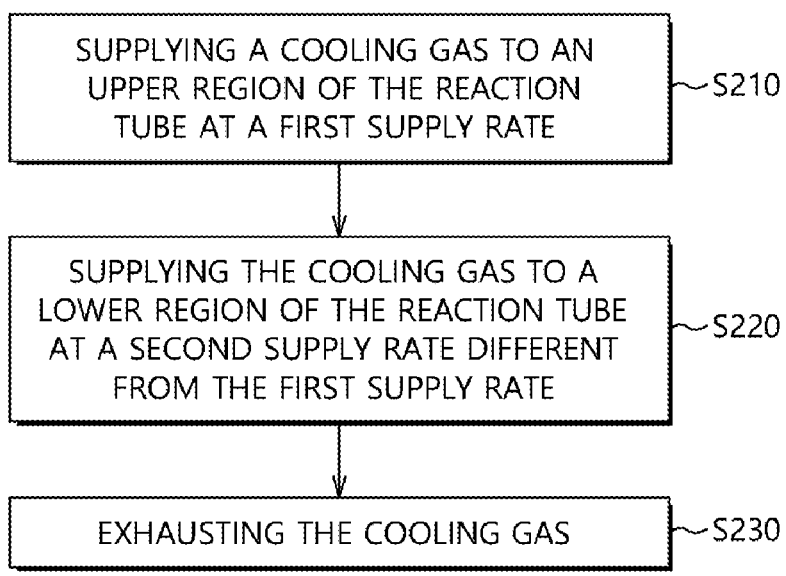
FIGS. 4B to 4D are flow charts, illustrating a process for cooling a reaction tube, in accordance with example embodiments.

FIG. 4B is a flow chart, illustrating a process for cooling a reaction tube, in accordance with example embodiments.

Referring to FIG. 4B, in step S210, the cooling gas may be supplied to the upper region of the space between the side cover and the reaction tube at the first supply rate. In step S220, the cooling gas may be supplied to the lower region of the space at the second supply rate, different from the first supply rate. In step S230, the cooling gas may be exhausted from the space between the side cover and the reaction tube.

Particularly, in step S210, the cooling gas may be supplied to the upper region of the space, between the side cover and the reaction tube, at the first supply rate. The cooling gas may be supplied to the upper region of the space, between the side cover and the reaction tube, through the first gas supplier connected to the upper portion of the side cover. The cooling gas may be supplied to the portion of the upper region in the space between the side cover and the reaction tube.

Particularly, in step S220, the cooling gas may be supplied to the lower region of the space at the second supply rate, different from the first supply rate. The cooling gas may be supplied to the lower region of the space between the side cover and the reaction tube through the second gas supplier connected to the lower portion of the side cover at the second supply rate different from the first supply rate. The cooling gas may be supplied to the rest of the lower region in the space between the side cover and the reaction tube.

Therefore, different amounts of the cooling gas may be supplied to the upper region and the lower region in the reaction tube to maintain the temperature uniformity in the reaction tube during the cooling of the reaction tube. Further, the supplying amounts of the cooling gas to the upper region and the lower region in the reaction tube may be controlled to effectively cool the reaction tube, in accordance with the temperature distribution of the reaction tube. Furthermore, the temperature deviation between the regions in the reaction tube may be decreased during cooling the reaction tube.

Particularly, in step S230, the cooling gas may be exhausted from the space between the side cover and the reaction tube. The cooling gas in the side cover may be exhausted through the radiant exhauster, connected to the lid, on the side cover. Because the hot air may be positioned in the upper region of the reaction tube due to convection, the heat may be effectively exhausted using the upwardly increasing hot air absorbing the heat in the reaction tube.

The amount of the cooling gas supplied to the upper region may be larger than the amount of the cooling gas supplied to the lower region. Because the hot air may stay for a longer time in the upper region compared to the hot air in the lower region due to convection, and the position of the radiant exhauster, configured to exhaust the cooling gas through the upper portion of the side cover, the upper region may be cooled relatively slower than the lower region. In contrast, because the cold air may stay in the lower region, where the hot air may be upwardly moved to the upper region, the lower region may be cooled relatively faster than the upper region. Thus, when the amount of the cooling gas supplied by the first gas supplier is substantially the same as or lower than the amount of the cooling gas supplied by the second gas supplier, the lower region of the reaction tube may be cooled relatively quickly to generate the temperature difference between the upper region and the lower region in the reaction tube. In this case, the substrates may have different temperatures in accordance with the positions of the substrates in the reaction tube so that layers on the substrates may have different characteristics. As a result, a uniform layer might not be formed on the substrates.

In example embodiments, because the supplying amount of the cooling gas by the first gas supplier, positioned at the upper region of the reaction tube, may be greater than that of the second gas supplier positioned at the lower region of the reaction tube, the cooling rate (cooling speed) of the upper region in the reaction tube may be improved to decrease the difference between the cooling speed in the upper region and the lower region of the reaction tube. Further, the temperature deviation between the upper region and the lower region in the reaction tube, which may be caused by cooling the lower region of the reaction tube relatively faster, may be prevented. Therefore, the substrate-processing step may be performed on the substrates in the reaction tube to obtain the uniform layer from the substrates.

Figure 4C:
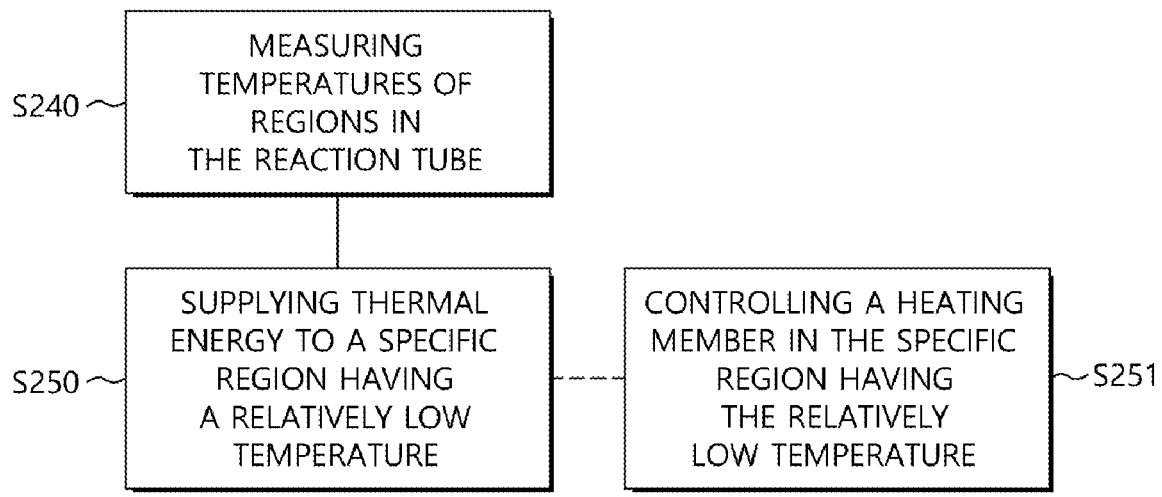
Figure 4D:
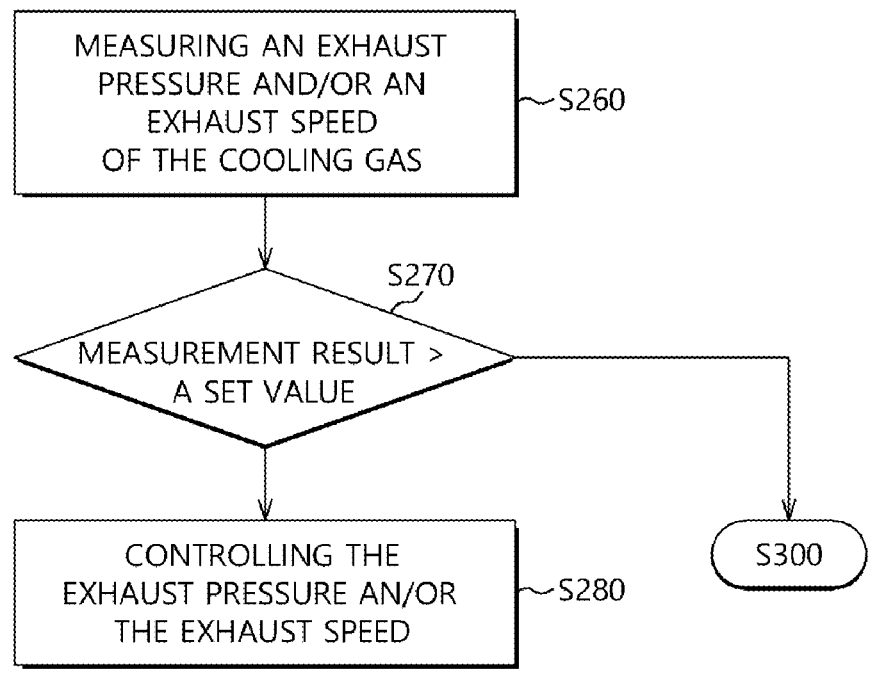

FIG. 4C is a flow chart, illustrating a process for cooling a reaction tube, in accordance with example embodiments.

Referring to FIG. 4C, the method of cooling the reaction tube may further include measuring the temperatures of the vertically is arranged regions in the reaction tube in step S240 and supplying the thermal energy to the specific region among the regions, having a relatively low temperature, in accordance with the temperatures of the regions in step S250.

Particularly, in step S240, the temperatures of the vertically arranged regions in the reaction tube may be measured.

The temperatures of the regions in the reaction tube may be measured using the temperature sensor to obtain the temperature distribution by the regions.

In step S250, the thermal energy may be supplied to the specific region, having the relatively low temperature, among the regions, in accordance with the measured temperatures of the regions. The thermal energy may be supplied to the specific region, having the relatively low temperature, in accordance with the temperatures of the regions, measured by the temperature sensor to reduce the temperature deviation between the regions.

The process for supplying the thermal energy to the specific region, having the relatively low temperature, in step S250, may include driving the heating member, corresponding to the specific region having the relatively low temperature, using the heater, including the heating members, divided by regions in step S251.

In step S251, the heating member, corresponding to the specific region, having the relatively low temperature, may be controlled by using the heater, including the heating members with is divided regions. The heating member may be controlled or driven using the heater to supply the thermal energy to the specific region having the relatively low temperature. Because the hot air in the lower region of the reaction tube may be upwardly moved due to convection, and the cold air may be positioned in the lower region, the temperature deviation between the upper region and the lower region in the reaction tube may be generated without the driving of the heater. The heating member, measured by the temperature sensor, may be driven using the heater to independently supply the thermal energy to the specific region, having the relatively low temperature, thereby minimizing the temperature deviation between the regions of the reaction tube.

Cooling the reaction tube, in step S200, may further include measuring the exhaust pressure and/or the exhaust speed of the cooling gas in step S260, determining whether the measured exhaust pressure and/or the measured exhaust speed of the cooling gas may be beyond the set value or not in step S270, and decreasing the exhaust pressure and/or the exhaust speed of the cooling gas to no more than the set value when the measured exhaust pressure and/or the measured exhaust speed is beyond the set value in step S280.

Particularly, in step S260, the exhaust pressure and/or the exhaust speed of the cooling gas may be measured. The exhaust pressure and/or the exhaust speed of the cooling gas may be measured using the exhaust measurement member, connected to the radiant exhauster. Because an exhaust amount may be changed, in accordance with the supply amount of the cooling gas, the exhaust pressure and/or the exhaust speed of the cooling gas may be measured to recognize the exhaust intensity. The exhaust pressure and/or the exhaust speed of the cooling gas may be measured using the output value of the blower in the radiant exhauster. Alternatively, the exhaust pressure and/or the exhaust speed of the cooling gas may be measured by installing the sensor on the exhaust pipe of the radiant exhauster.

In step S270, whether the measured exhaust pressure and/or the measured exhaust speed of the cooling gas may be beyond the set value or not may be determined. Whether the measured exhaust pressure and/or the measured exhaust speed of the cooling gas may be beyond the set value or not may be determined by using the controller to maintain the exhaust pressure and/or the exhaust speed of no more than the set value.

In step S280, the exhaust pressure and/or the exhaust speed of the cooling gas to no more than the set value may be decreased when the measured exhaust pressure and/or the measured exhaust speed is beyond the set value. When the exhaust pressure and/or the exhaust speed of the radiant exhauster is beyond the set value, stresses applied to the byproducts on the inner surface of the reaction tube may be increased to generate a crack in the byproducts. Thus, particles may be generated from the crack in the reaction tube. In order to prevent the generation of the particles, the is exhaust pressure and/or the exhaust speed of the radiant exhauster may be monitored and controlled through the exhaust measurement member to prevent the crack and the lamination of the byproducts in the reaction tube and to improve the cooling speed compared to the natural cooling speed.

Based on example embodiments, the supplying amounts of the cooling gas to the upper region and the lower region in the reaction tube may be different from each other in accordance with the temperature distribution of the reaction tube to effectively cool the reaction tube and to reduce the temperature deviation between the regions of the reaction tube. That is, because the hot air may be positioned in the upper region due to convection, the relatively large amount of the cooling air may be supplied to the upper region of the reaction tube to effectively cool the reaction tube. In contrast, the relatively small amount of the cooling air may be supplied to the lower region of the reaction tube to prevent the lower region from being relatively rapidly cooled, thereby reduce the temperature deviation between the upper region and the lower region in the reaction tube. Further, because the hot air in the lower region of the reaction tube may be upwardly moved due to convection and the cold air may be positioned in the lower region, the temperature deviation between the upper region and the lower region in the reaction tube may be generated without the driving of the heater. The heating member corresponding to the specific region having the relatively low temperature in accordance with the temperatures of the regions is measured by the temperature sensor may be driven using the heater including the heating members divided the regions to independently supply the thermal energy to the specific region having the relatively low temperature, thereby minimizing the temperature deviation between the regions of the reaction tube. Furthermore, the exhaust pressure and/or the exhaust speed of the cooling gas may be maintained under no more than the set value to prevent the crack and the lamination of the byproducts in the reaction tube and to improve the cooling speed compared to the natural cooling speed.

The above described embodiments of the present invention are intended to illustrate and not to limit the present invention. Various alternatives and equivalents are possible. The invention is not limited by the embodiments described herein. Nor is the invention limited to any specific type of semiconductor device. Another addition, subtractions, or modifications are obvious in view of the present disclosure and are intended to fall within the scope of the appended claims.

What is claimed is:

1. An apparatus for processing a substrate, the apparatus including an internal space divided into a plurality of sub-spaces in a vertical direction, the apparatus comprising:
    a reaction tube arranged at the internal space, the reaction tube that processes a plurality of substrates stacked in the vertical direction;
    a side cover arranged to surround the reaction tube, the side cover including a plurality of gas transmission holes arranged along the vertical direction at a selected portion of the side cover; and a heater arranged between the reaction tube and the side cover, the heater including a plurality of unit heaters for each of the plurality of sub-spaces, the plurality of unit heaters separated by a is plurality of first holes, wherein each of the unit heaters includes an adiabatic block for surrounding the reaction tube, the adiabatic block including a plurality of second holes radially formed therein and divided into a plurality of adiabatic regions; and a coil arranged on an inner surface of the adiabatic block, wherein a cooling gas is transmitted through the plurality of first holes and the plurality of second holes, and temperature of the adiabatic block is lowered by the cooling gas flowing through the plurality of first and second holes.

2. The apparatus of claim 1, further comprising:
a cooling gas supplier that supplies a first amount of cooling gas to an upper portion of the internal space and supplies a second amount of the cooling gas smaller than the first amount to a lower portion of the internal space.

3. The apparatus of claim 1, further comprising:
a first gas supplier that supplies the cooling gas to an upper portion of the internal space, the first gas supplier including a first duct installed outside of the side cover to define a first external cooling space between the side cover and the first duct, and at least one first gas line connected to the first duct to transmit injected cooling gas to the first external cooling space; and a second gas supplier that supplies the cooling gas to the lower portion of the internal space, the second gas supplier including a second duct installed outside of the side cover under the first duct to define a second external cooling space between the side cover and the second duct, and at least one second gas line connected to the second duct to transmit injected cooling gas to the second external cooling space.

4. The apparatus of claim 3, wherein the first duct and the second duct are installed to cover the plurality of gas transmission holes arranged in the side cover,
wherein the cooling gas in the first and second external cooling spaces transmits to inside of the side cover through the plurality of gas transmission holes.

5. The apparatus of claim 3, wherein a length of the first duct is longer than a length of the second duct.

6. The apparatus of claim 3, wherein the number of first transmission holes covered by the first duct is greater than the number of transmission holes covered by the second duct.

7. The apparatus of claim 3, further comprising:
an exhauster installed on the side cover, the exhauster including a first exhaust line communicating with the internal space and a second exhaust line.

8. The apparatus of claim 7, wherein a diameter of the first exhaust line is greater than a diameter of the first gas line and a diameter of the second gas line.

9. The apparatus of claim 7, further comprising:
a lid that seals an opened upper surface of the side cover, wherein the first exhaust line is inserted into the lid.

10. The apparatus of claim 1, further comprising:
a controller that controls a cooling rate of the reaction tube.

11. The apparatus of claim 10, further comprising at least one temperature sensor that measures temperatures of the plurality of sub-spaces.

12. The apparatus of claim 10, wherein the controller receives measured temperatures from the temperature sensor to independently control the plurality of unit heaters based on the measured temperatures.

13. The apparatus of claim 12, wherein each of the unit heaters further includes an adhesion pattern for bonding the adiabatic block and the side cover.

14. The apparatus of claim 13, wherein a thickness of the adhesion pattern is shallower than a thickness of the adiabatic block.

* * * * *